United States Patent
White et al.

(10) Patent No.: US 7,923,769 B2
(45) Date of Patent: Apr. 12, 2011

(54) SPLIT GATE NON-VOLATILE MEMORY CELL WITH IMPROVED ENDURANCE AND METHOD THEREFOR

(75) Inventors: Ted R. White, Austin, TX (US); Brian A. Winstead, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/909,027

(22) Filed: Oct. 21, 2010

(65) Prior Publication Data

US 2011/0031548 A1    Feb. 10, 2011

Related U.S. Application Data

(62) Division of application No. 12/103,246, filed on Apr. 15, 2008.

(51) Int. Cl.
*H01L 29/76* (2006.01)

(52) U.S. Cl. ............. 257/319; 257/E29.3; 257/E29.112; 257/E21.422; 257/E21.179; 438/266; 438/260

(58) Field of Classification Search ................. 257/319, 257/E29.3, E29.112, E21.422, E21.179; 438/266, 438/260
See application file for complete search history.

(56) References Cited

U.S. PATENT DOCUMENTS

| | | | |
|---|---|---|---|
| 6,229,176 B1 | 5/2001 | Hsieh et al. | |
| 6,828,618 B2 | 12/2004 | Baker et al. | |
| 6,838,725 B2 | 1/2005 | Lin et al. | |
| 7,544,980 B2 | 6/2009 | Chindalore et al. | |
| 7,652,319 B2 * | 1/2010 | Tsurumi et al. | 257/315 |
| 7,727,829 B2 | 6/2010 | Trivedi et al. | |
| 7,732,855 B2 * | 6/2010 | Park et al. | 257/316 |
| 7,737,018 B2 | 6/2010 | Matthew et al. | |
| 7,811,886 B2 | 10/2010 | Winstead et al. | |
| 2005/0082601 A1 | 4/2005 | Chu et al. | |
| 2005/0085039 A1 | 4/2005 | Yasui et al. | |
| 2005/0199940 A1 | 9/2005 | Mine et al. | |
| 2007/0029607 A1 | 2/2007 | Kouznetzov | |
| 2007/0093010 A1 | 4/2007 | Matthew et al. | |

OTHER PUBLICATIONS

Palestri et al., "Effect of the gap size on the SSI efficiency of split-gate memory cells", IEEE Transactions on Electron Devices, vol. 53, Issue 3, Mar. 2006 pp. 488-493.
U.S. Appl. No. 12/103,451, filed Apr. 15, 2008, Inventor Sung-Taeg Kang, et al.
Non-final-office action dated Apr. 6, 2010 in U.S. Appl. No. 12/103,246.

* cited by examiner

*Primary Examiner* — Tu-Tu V Ho
(74) *Attorney, Agent, or Firm* — James L. Clingan, Jr.; Ranjeev Singh

(57) ABSTRACT

A non-volatile memory cell including a substrate in which is formed a source region and a drain region defining a channel region between the source region and the drain region is provided. The non-volatile memory cell further includes a select gate structure overlying a first portion of the channel region. The non-volatile memory cell further includes a control gate structure formed overlying a second portion of the channel region, wherein the control gate structure includes a nanocrystal stack having a height, wherein the control gate structure has a convex shape in a corner region formed at an intersection of a first plane substantially parallel to a top surface of the substrate and a second plane substantially parallel to a side surface of the control gate structure, wherein a ratio of radius of the control gate structure in the corner region to the height of the nanocrystal stack is at least 0.5.

9 Claims, 10 Drawing Sheets

SPLIT GATE NON-VOLATILE MEMORY CELL WITH IMPROVED ENDURANCE AND METHOD THEREFOR

BACKGROUND

1. Field

This disclosure relates generally to non-volatile memories (NVMs), and more specifically, to NVM cells with split gates.

2. Related Art

Split gate non-volatile memories (NVMs) have been developed as providing advantages over the typical control gate over a floating gate. They are particularly useful in the case of the storage element layer being much thinner than the typical floating gate. One type of storage layer that offers benefits is a layer of nanocrystals. Nitride has the potential to also be beneficial. As al of the layers, including the storage layers, get thinner though, electrical effects are not necessarily the same as for a floating gate. One example is endurance which is measured by how many program/erase cycles can be performed before a memory cell fails. This is particularly a problem for thin storage layer split gate NVM cells.

Accordingly, there is a need for a split gate structure, as well as a method for making it, that provides for improved endurance.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A split gate non-volatile memory cell provides increased endurance by reducing the electrical field at a corner of the control gate. This is achieved by increasing the radius of curvature of that corner. The effect then is that during erase there is less trap-up. Traps are locations in the dielectric under the control gate that can trap electrons. As more and more traps become filled with electrons, the difference between a programmed state and an erased state becomes less and thus becomes harder to detect. The increase in radius curvature results in reducing the field and thus avoids the corner region providing an inordinate contribution to trap-up.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
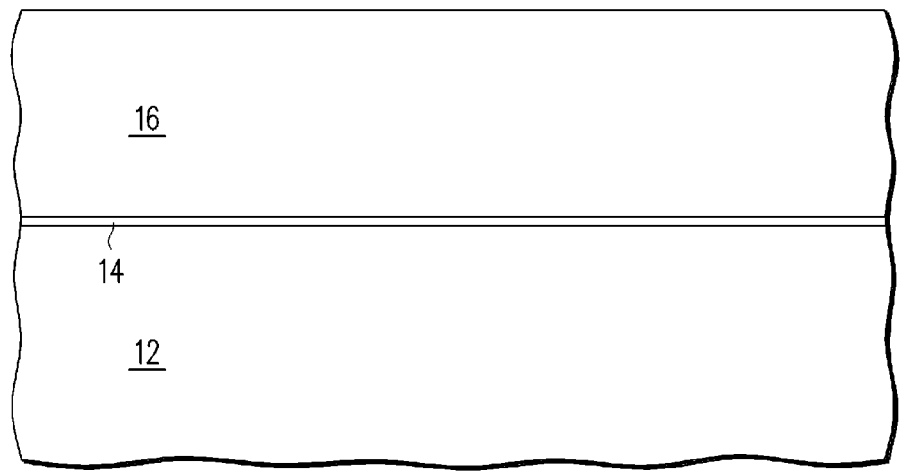
FIG. 1 is a semiconductor device at a stage in processing according to a first embodiment.

Shown in FIG. 1 is a semiconductor device 10 comprising a semiconductor substrate 12, a gate dielectric 14 on semiconductor substrate 12, and a polysilicon layer 16 over gate dielectric 14. Gate dielectric 14 may be a grown oxide which is common for gate dielectrics and may be 2 nanometers in thickness. A high K dielectric may also be used and would likely have a different thickness. Polysilicon layer 16 may be 150 nanometers in this example but could be another thickness.

Figure 2:
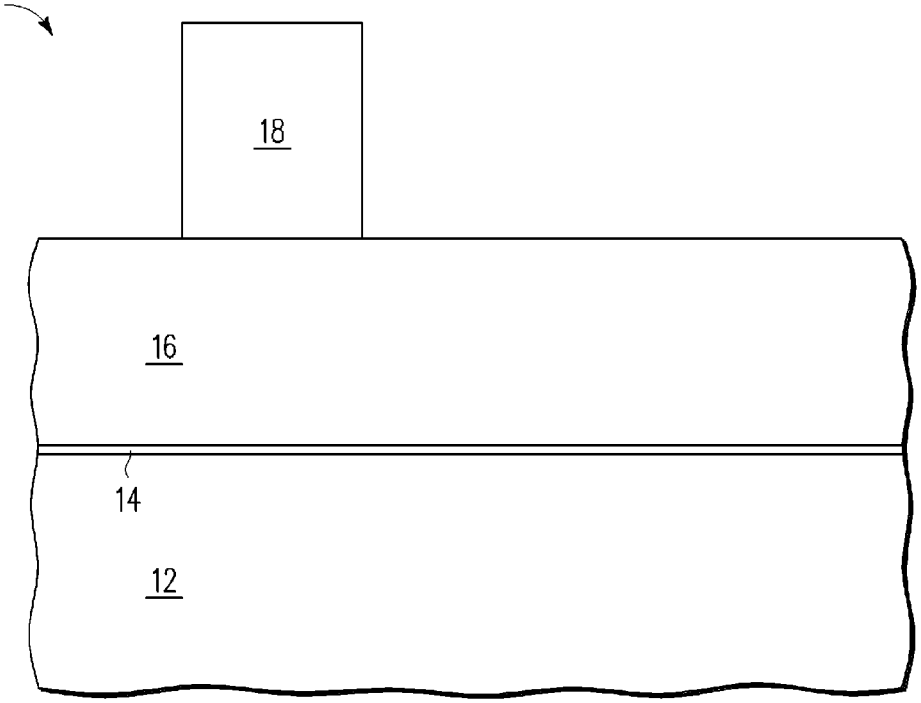
FIG. 2 is the semiconductor device of FIG. 1 at a subsequent stage in processing.

Shown in FIG. 2 is semiconductor device 10 after patterning a photoresist layer to form a mask 18 of photoresist over polysilicon layer 16.

Figure 3:
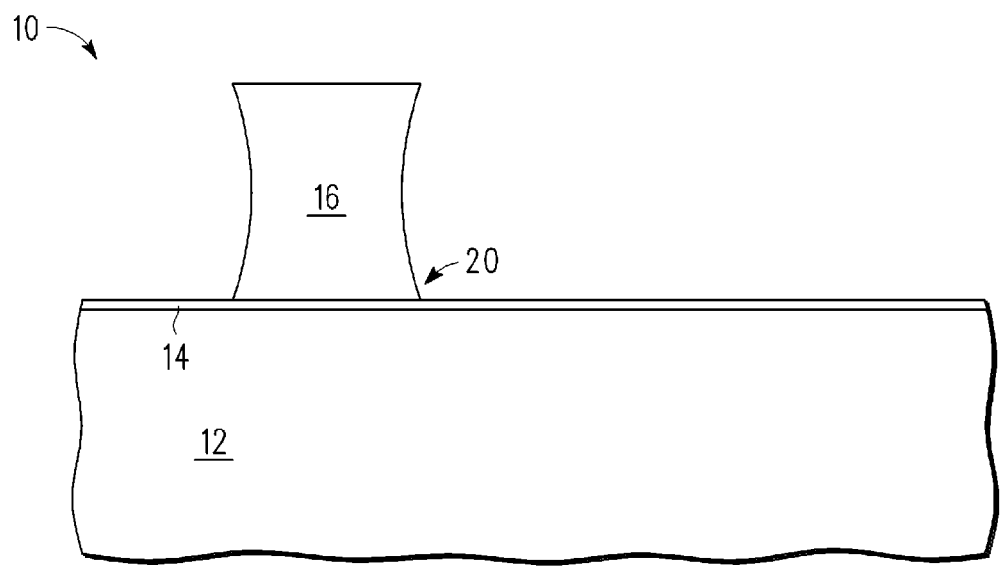
FIG. 3 is the semiconductor device of FIG. 2 at a subsequent stage in processing.

Shown in FIG. 3 is semiconductor device 10 after performing an etch of polysilicon layer using mask 18 for defining the pattern of the remaining portion of polysilicon layer 16 which has concave sides. In particular there is a curve 20 at the area where the remaining portion of polysilicon layer 16 meets an exposed portion of gate dielectric 14. This curve is chosen to have at least a minimum radius of curvature. The process for achieving the concave sides and curve 20 in particular are achieved using well understood isotropic and anisotropic etch components as the etch proceeds. Although this shape shown in FIG. 3 would not generally be considered desirable, they are achievable using conventional techniques available on standard equipment used in etching polysilicon. Other effective shapes may also be achieved so long as curve 20 is achieved. For example, the sides may be vertical until near the bottom where curve 20 is formed. The concave sides are considered preferable to achieve more contact area on the top surface. The remaining portion of polysilicon layer 16 will be used as the select gate in the split gate memory cell to be formed from semiconductor device 10 and may be referenced as select gate 16.

Figure 4:
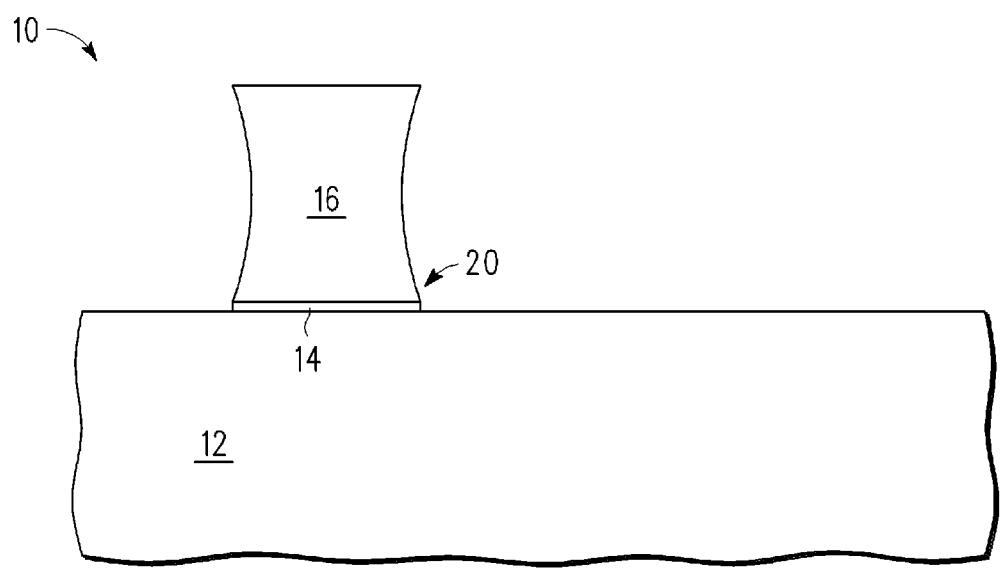
FIG. 4 is the semiconductor device of FIG. 3 at a subsequent stage in processing.

Shown in FIG. 4 is semiconductor device 10 after the exposed portion of gate dielectric 14 using the remaining portion of polysilicon layer 16 as a mask. The result is that gate dielectric as shown in FIG. 4 is only under the remaining portion of polysilicon layer 16.

Figure 5:
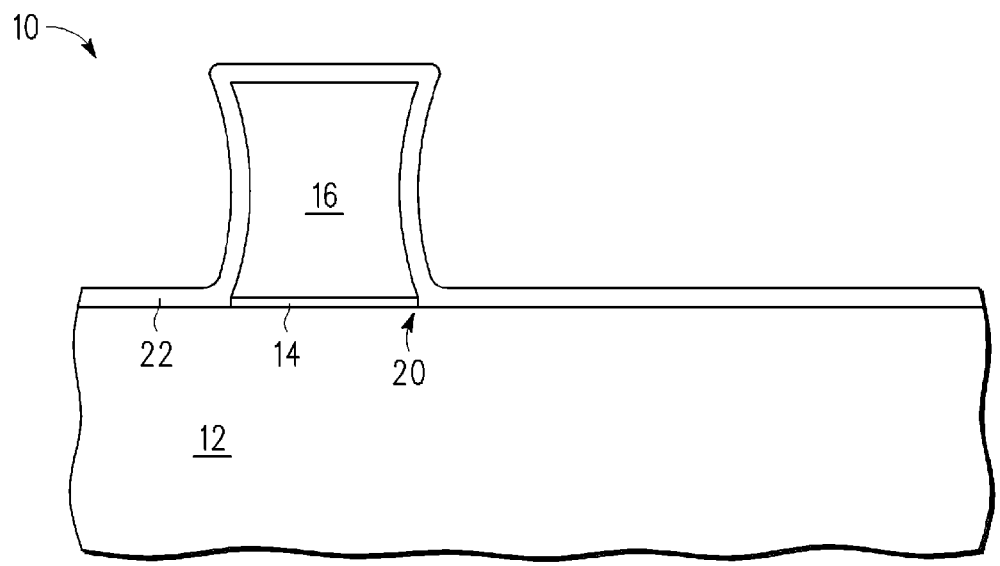
FIG. 5 is the semiconductor device of FIG. 4 at a subsequent stage in processing.

Shown in FIG. 5 is a semiconductor device 10 after forming an insulating layer 22 over the exposed portion of substrate 12 and over the remaining portion of polysilicon layer 16 which may be conveniently achieved by growing oxide. Insulating layer 22 may be 5 nanometers thick.

Figure 6:
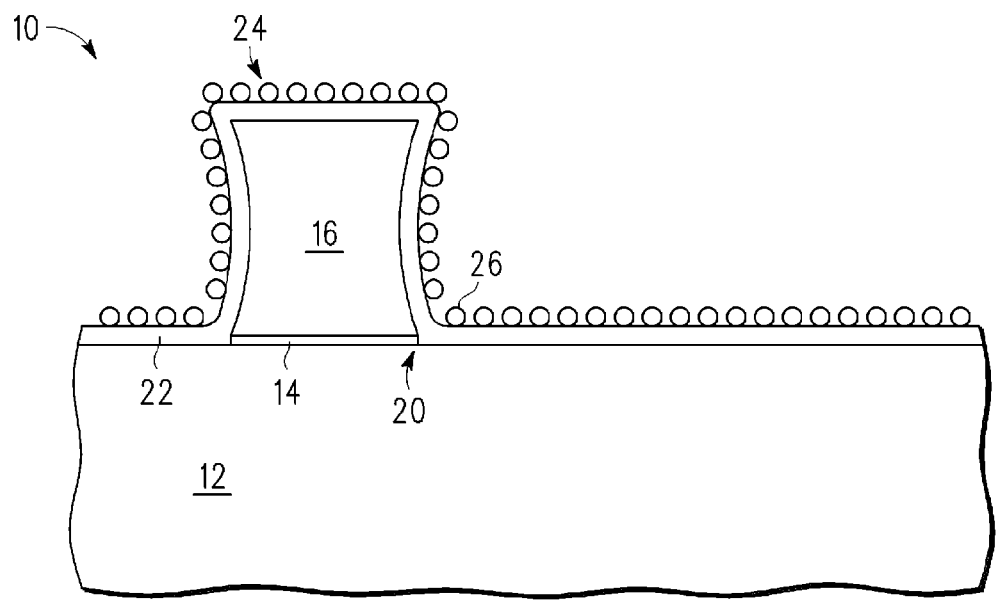
FIG. 6 is the semiconductor device of FIG. 5 at a subsequent stage in processing.

Shown in FIG. 6 is semiconductor device 10 after forming a layer of nanocrystals 24 including a nanocrystal 26 formed near curve 20. The nanocrystals are 5 nanometers in diameter and also about 5 nanometers apart.

Figure 7:
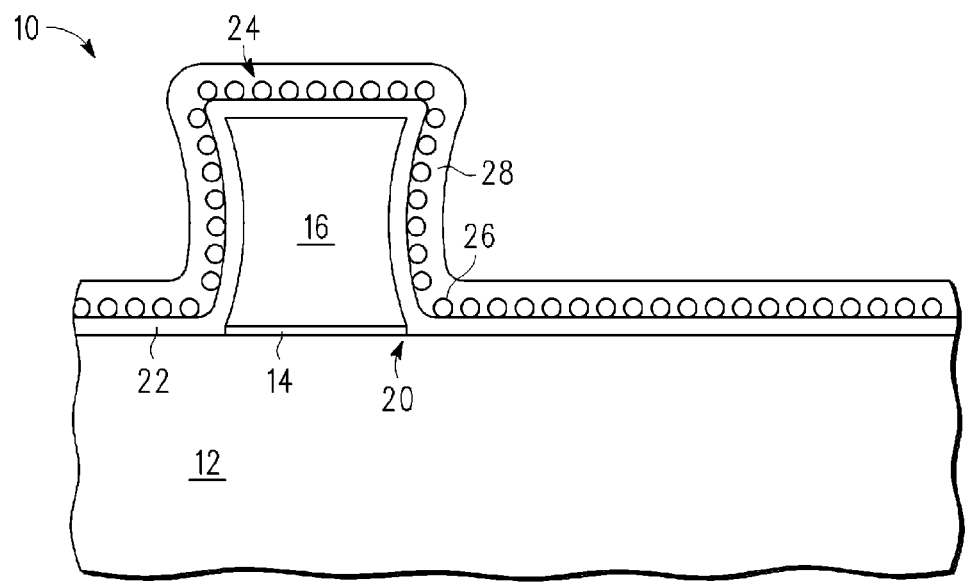
FIG. 7 is the semiconductor device of FIG. 6 at a subsequent stage in processing.

Shown in FIG. 7 is semiconductor device 10 after forming an insulating layer 28 over and around nanocrystals 28. Insulating layer 28 may be formed by deposition of an oxide such as by low pressure chemical vapor deposition (LPCVD) high temperature oxide (HTO). The thickness of insulating layer 28 may be about 10 nanometers above the nanocrystals. With the nanocrystals being about 5 nanometers in diameter the combined thickness of the storage layer comprised of layers 22 and 28 and nanocrystals 24 is about 20 nanometers.

Figure 8:
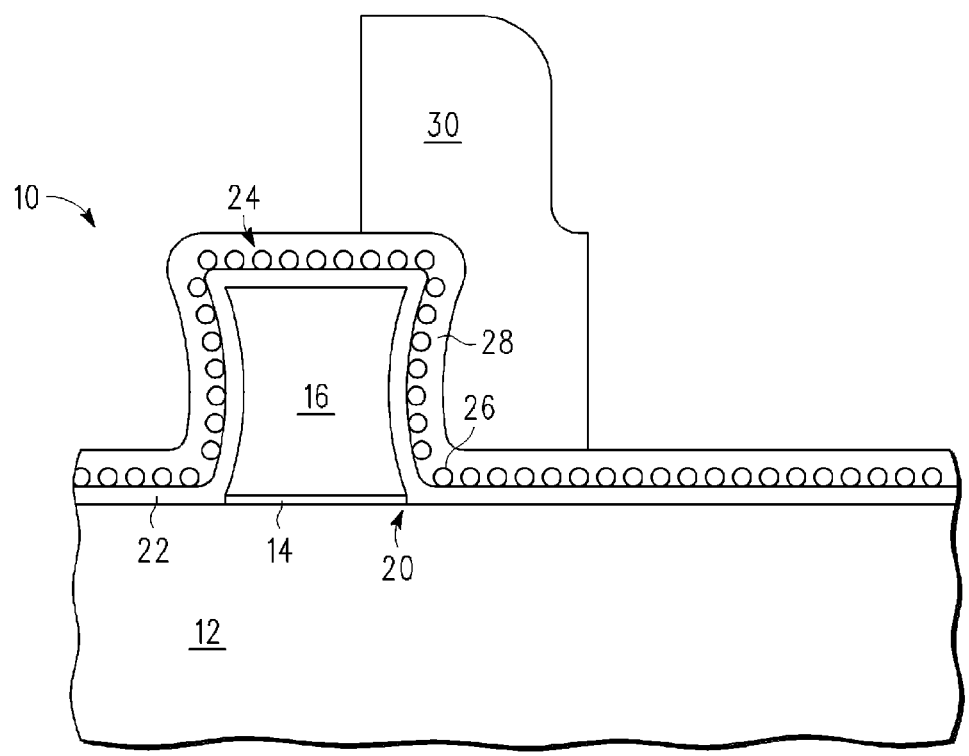
FIG. 8 is the semiconductor device of FIG. 7 at a subsequent stage in processing.

Shown in FIG. 8 is semiconductor device 10 after depositing a polysilicon layer and patterning it to form a control gate 30. Control gate 30 is over a portion of select gate 16 and extends laterally from select gate 16 over insulating layer 28. Control gate 30 may be about the same thickness of select gate 16 which may be 150 nanometers.

Figure 9:
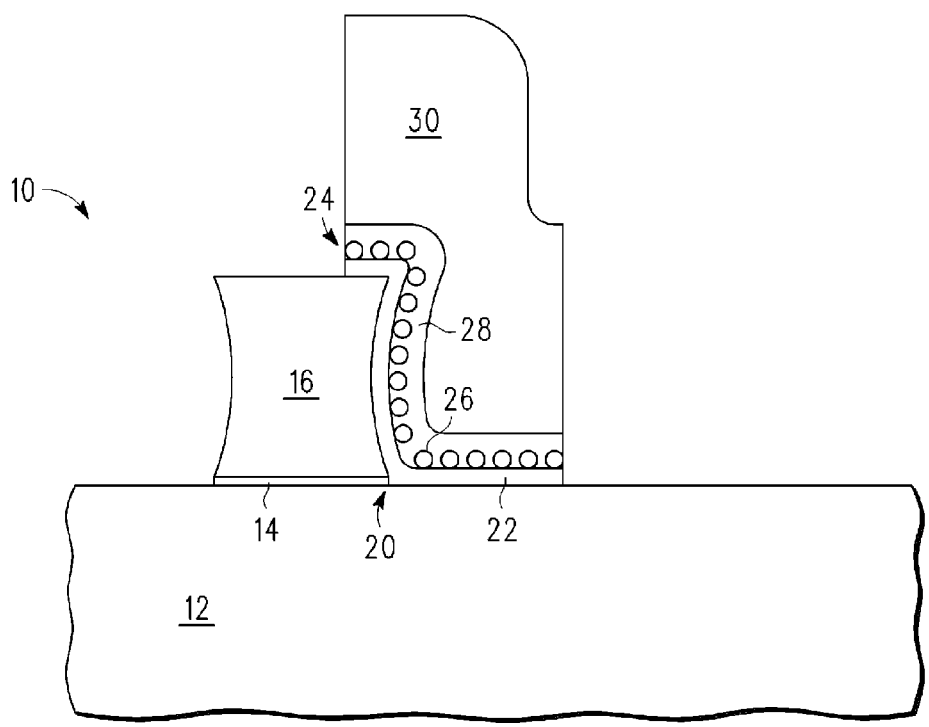
FIG. 9 is the semiconductor device of FIG. 8 at a subsequent stage in processing.

Shown in FIG. 9 is semiconductor device 10 after removing insulating layers 28 and 22 and nanocrystals 24 in the exposed areas so that insulating layers 28 and 22 and nanocrystals 24 are under control gate 30 and between control gate 30 and select gate 16.

Figure 10:
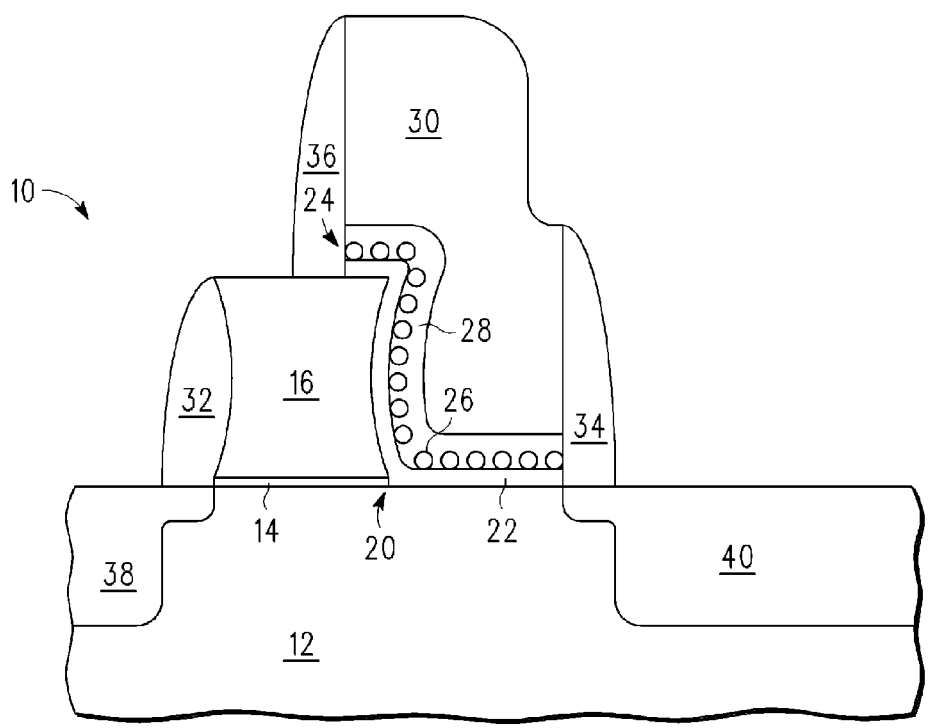
FIG. 10 is the semiconductor device of FIG. 9 at a subsequent stage in processing providing a split gate NVM cell.

Shown in FIG. 10 is semiconductor device 10 after forming sidewall spacers 32, 36, and 34 around select gate 16 and control gate 30 and forming source/drain regions 38 and 40 on opposing sides of select gate 16 and control gate 30. Semiconductor device 10 of FIG. 10 is a split gate NVM cell. The FIGs. are not drawn to scale in particular to be able to shown the nanocrystals and the insulating layers on both sides of the nanocrystals. This may have the effect of not appearing to be as the device would be. For example, control gate 30 overlaps select gate 16 which is more clearly shown in FIG. 11. Siliciding the gates and source/drains may also be performed.

Figure 11:
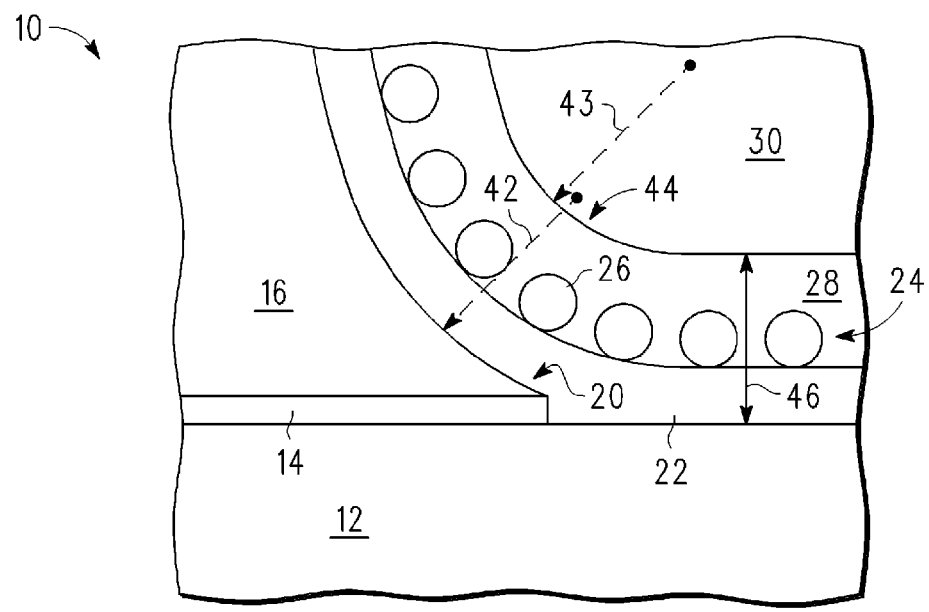
FIG. 11 is a portion of the semiconductor device of FIG. 10.

Shown in FIG. 11 is portion of semiconductor device 10 of FIG. 10 so that more detail of the region near curve 20 may be shown. As shown in FIG. 11, curve 20 of select gate 16 has a radius of curvature 42 that causes curves in the top surface of insulating layer 22 and the top surface of insulating layer 28, which is shown as curve 44 having radius of curvature 43, to have the same radius of curvature. Also shown is the overall thickness of layers 22 and 28 and nanocrystals 24 is a thickness 46. Radius of curvatures 42 and 43 are desirably the same as thickness 46. This is preferred because the radius of curvature at the corner where nanocrystal 26 is located is inversely proportional to the electric field. This corner location can be a problem because of excessive trap-up due to the increased electric field if the corner is sharp, such as having a radius of curvature of 5 nanometers which is a common radius of curvature for current geometries. The electric field for the nanocrystals not at the corner and used for storage is directly related to thickness 46. The result is that when curvature of radius 43 equals thickness 46 all of the nanocrystals used for storage receive about the same field. Thus, all of the nanocrystals have about the same affect on trap-up. Thus, the nanocrystal in the corner no longer has a greatly increased electric field applied to it and therefore does not have a greatly increased trap-up problem. Much of the benefit can still be achieved with a somewhat increased radius of curvature. A significant improvement can be achieved with the radius of curvature being half of thickness 46. In this case of thickness 46 being 20 nanometers, the optimum for radius of curvature 43 may be 20 nanometers but 10 nanometers would provide substantial benefit over the 5 nanometers or less that would normally occur under conventional objectives. Also the radius of curvature may exceed thickness of 46 further reducing trap-up at the corners.

Figure 12:
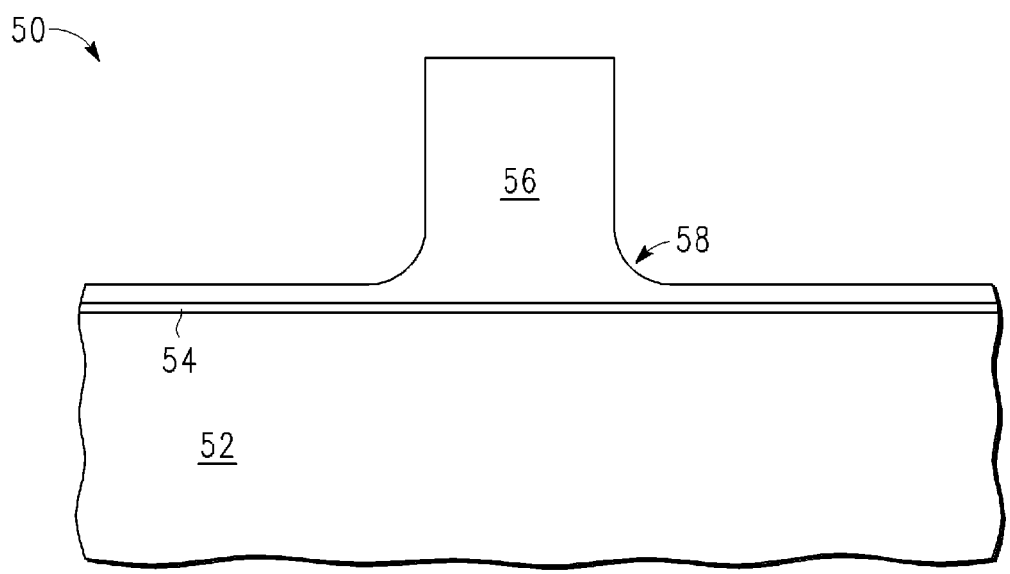
FIG. 12 a semiconductor device at a stage in processing according to a second embodiment.

Shown in FIG. 12 is a semiconductor device 50 comprising a substrate 52, a gate dielectric 54, and a polysilicon structure 56 formed by patterning a deposited polysilicon layer. The patterning is done with a conventional mask such as mask 18 of FIG. 2 and performing a partial etch so that a thin portion of about 5 nanometers is left in the exposed portion. This results in a curve 58 where the exposed portion meets the masked portion. This curve is easily achieved. The vertical edge all the way to the substrate that is generally considered desirable is achieved by continuing the etch after some of the substrate has been exposed. The radius of curvature of curve 58 can be controlled by the selected combination of isotropic and isotropic components of a polysilicon etch.

Figure 13:
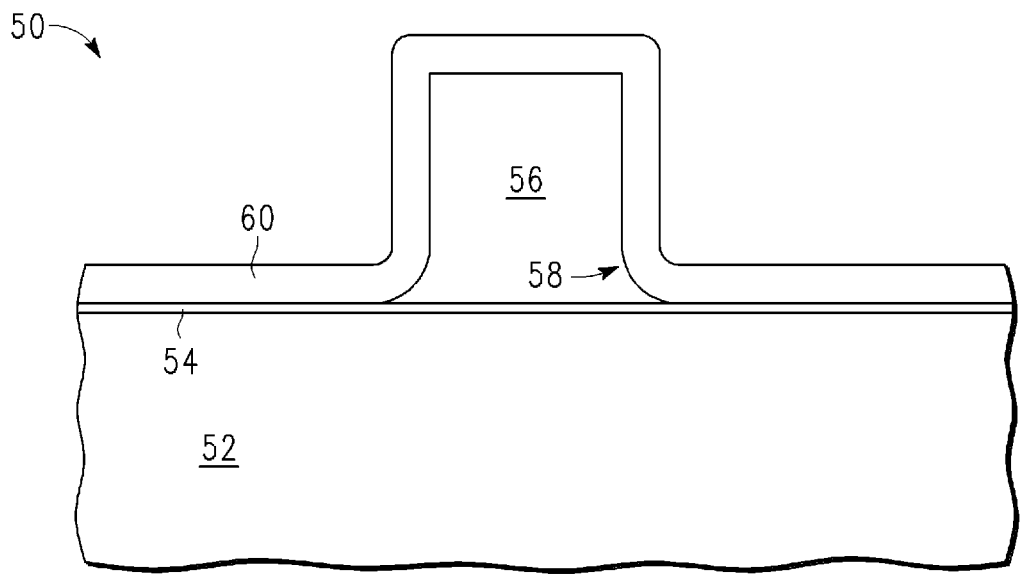
FIG. 13 is the semiconductor device of FIG. 12 at a subsequent stage in processing.

Shown in FIG. 13 is semiconductor device 10 after growing an oxide layer 60 and consuming the thin portion of polysilicon structure 56. Curve 58 is retained.

Figure 14:
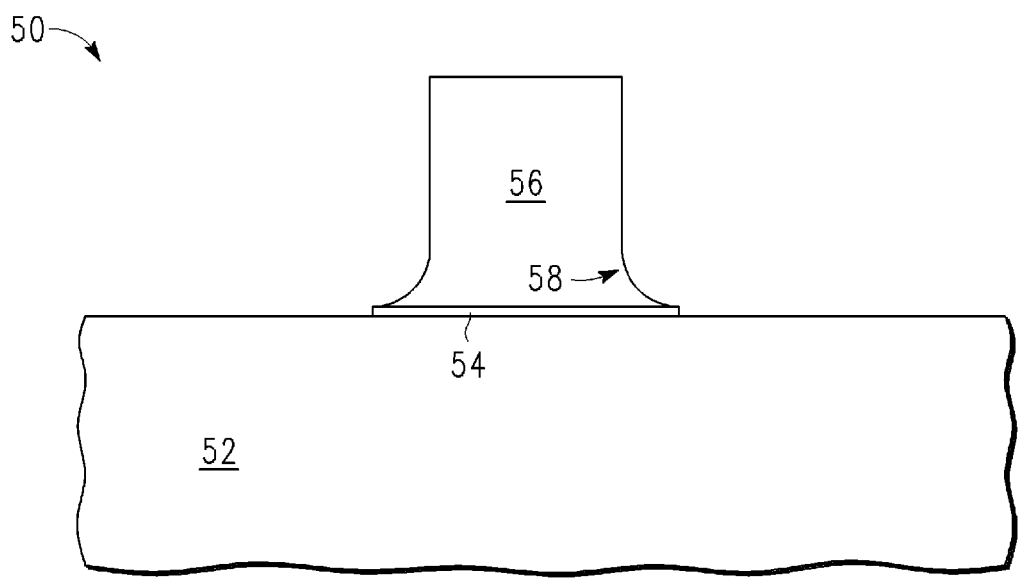
FIG. 14 is the semiconductor device of FIG. 13 at a subsequent stage in processing that is useful in a spit gate structure such as that of FIG. 10.

Shown in FIG. 14 is semiconductor device 10 after removing oxide layer 60. The resulting semiconductor structure 50 is similar to semiconductor device 10 of FIG. 4. The processing shown and described for FIGS. 5-10 may be applied to semiconductor structure 50 of FIG. 4 to achieve a split gate with the desirable characteristic of reducing trap-up at the corner nanocrystal. Similarly, the radius of curvature of curve 58 is chosen to provide the desired reduced trapping and is probably optimally chosen to be the same as thickness 46 but could be a different ratio but at least 0.5 to one.

Figure 15:
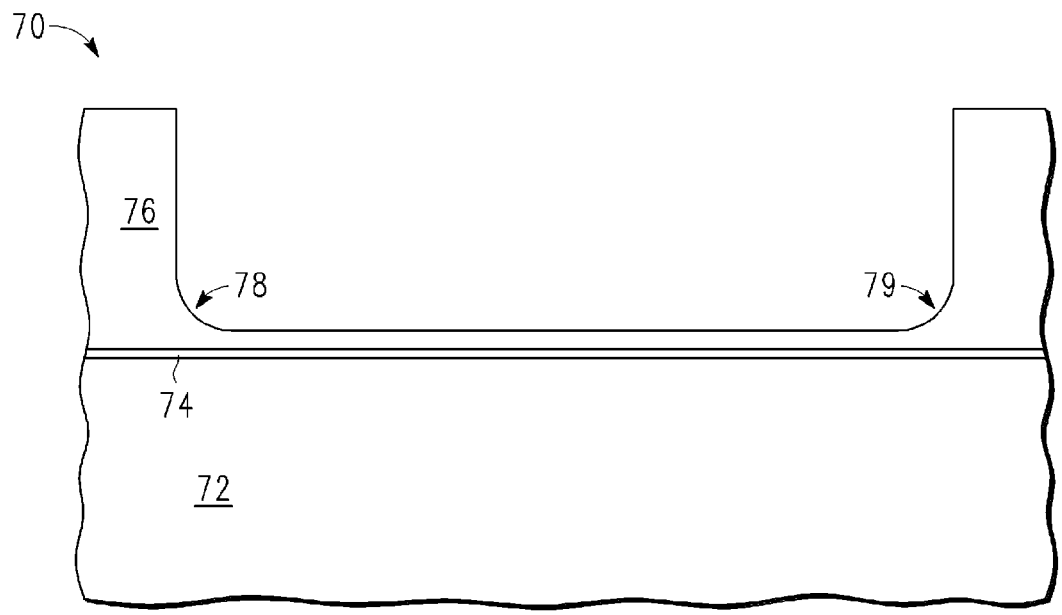
FIG. 15 a semiconductor device at a stage in processing according to a third embodiment

Shown in FIG. 15 is a semiconductor device 70 comprising a substrate 72, a gate dielectric 74, and a semiconductor structure 76. Semiconductor structure 76 is made in a similar manner to semiconductor structure 50 of FIG. 12 except that two fin-like structures, which would be the masked areas, are shown interconnected by a thin portion. Similar to curve 58, there are curves 78 and 79 at the bottom of the fin-like structures that have the desired radius of curvature.

Figure 16:
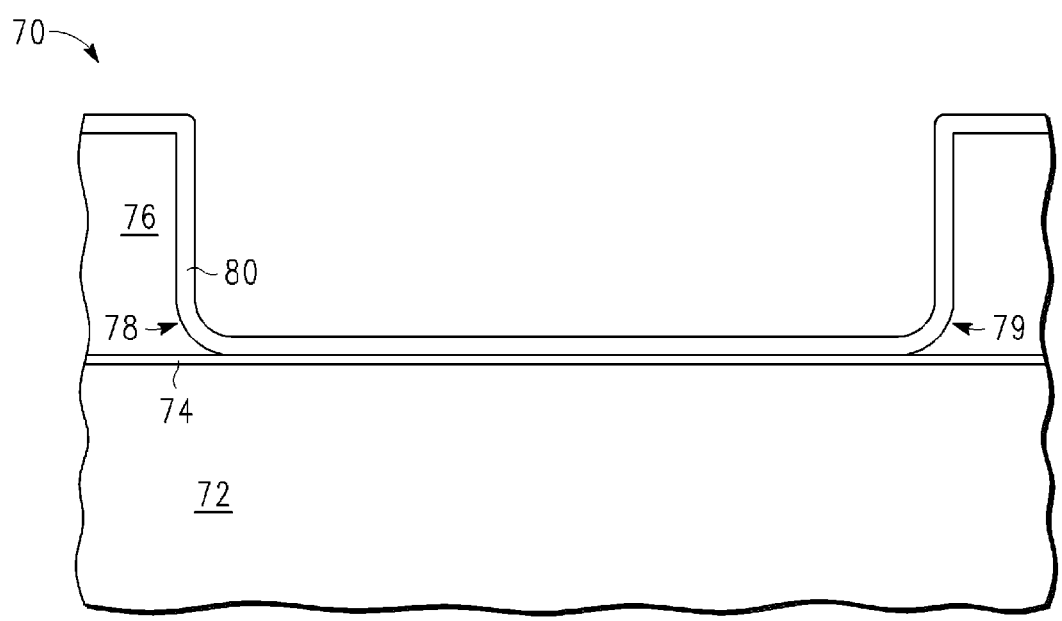
FIG. 16 is the semiconductor device of FIG. 15 at a subsequent stage in processing.

Shown in FIG. 16 is semiconductor device 70 after growing an oxide layer 80 that consumes the thin portion.

Figure 17:
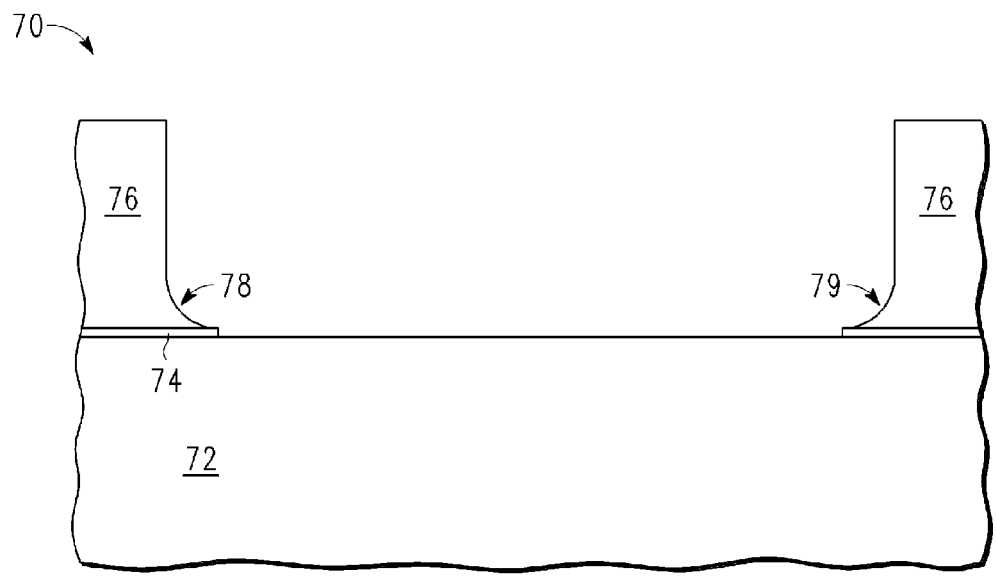
FIG. 17 is the semiconductor device of FIG. 16 at a subsequent stage in processing.

Shown in FIG. 17 is semiconductor device 70 after removing oxide layer 80. Curves 78 and 79 are retained. This exposes a portion of substrate 72 between the fin-like structures.

Figure 18:
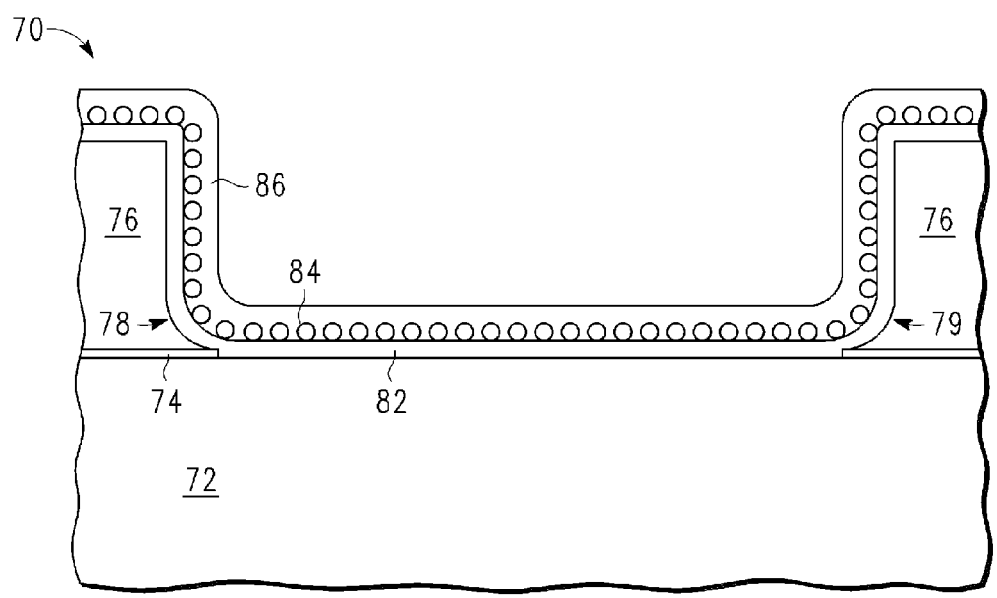
FIG. 18 is the semiconductor device of FIG. 17 at a subsequent stage in processing.

Shown in FIG. 18 is semiconductor device 70 after forming a thin storage layer comprised of a bottom oxide 82 and a layer of nanocrystals 84 embedded in a top oxide which may be formed the same as insulating layers 22 and 28 and nanocrystals 24 of FIGS. 5-7.

Figure 19:
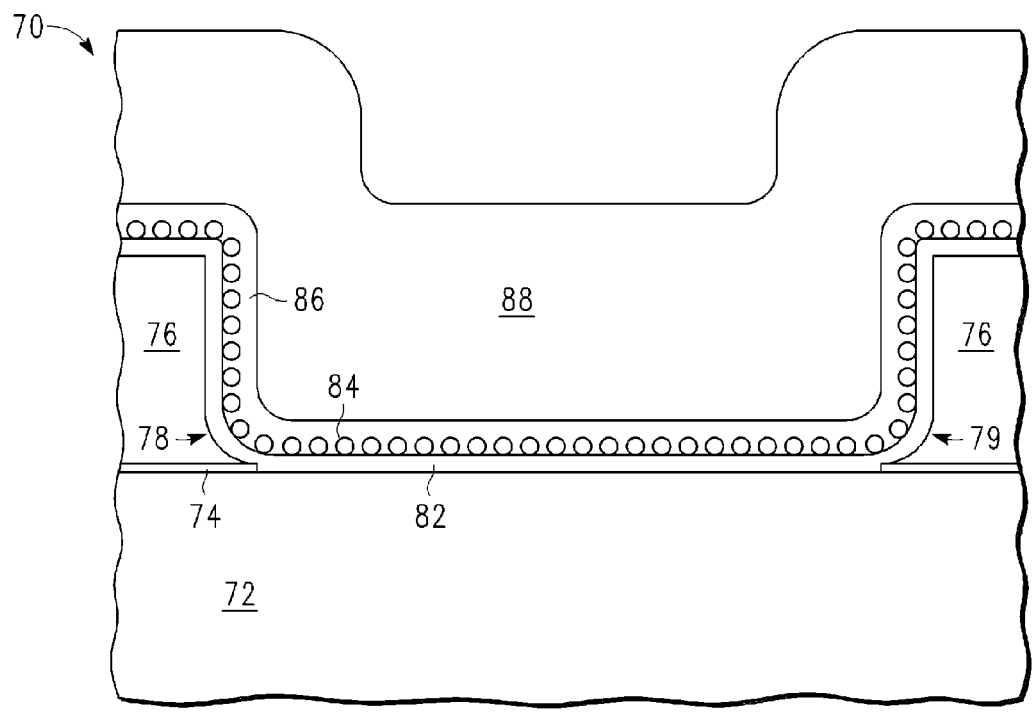
FIG. 19 is the semiconductor device of FIG. 18 at a subsequent stage in processing.

Shown in FIG. 19 semiconductor device 70 after forming a polysilicon layer 88 over top oxide 86. Polysilicon layer 88 may be formed to the same thickness as the height of the fin-like structures.

Figure 20:
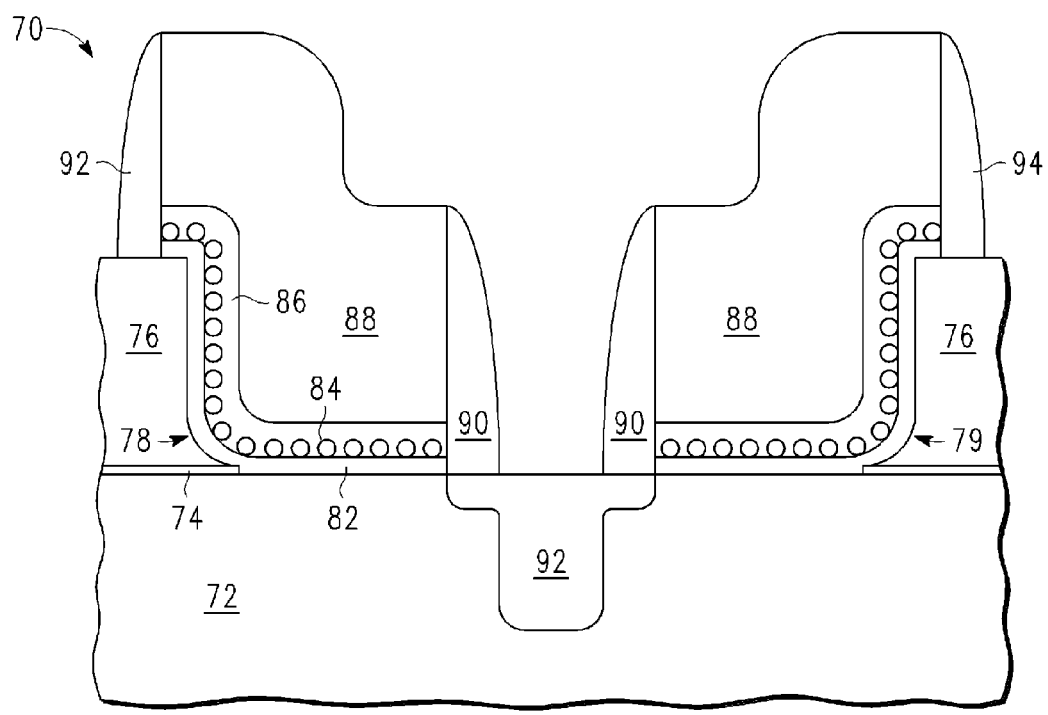
FIG. 20 is the semiconductor device of FIG. 19 at a subsequent stage in processing providing a split gate NVM cell.

Shown in FIG. 20 is semiconductor device 70 after patterning polysilicon layer 88 including opening top oxide 86 and bottom oxide 82 between the fin-like structures to form a common source/drain region. The polysilicon layer 88 is thus split into two portions in which each portion is a control gate and the fin-like structures are select gates. Sidewall spacer 90 is formed around the opening through top oxide 86 and bottom oxide 82. Sidewall spacer 92 and 94 are also formed on the outer sides of the control gates coincident with forming sidewall spacers 90.

By now it should be appreciated that there has been provided a non-volatile memory cell. The non-volatile memory cell includes a substrate in which is formed a source region and a drain region defining a channel region between the source region and the drain region. The non-volatile memory cell further includes a select gate structure formed over the substrate, wherein the select gate structure overlies a first portion of the channel region. The non-volatile memory cell further includes a control gate structure formed adjacent to the select gate structure, wherein the control gate structure overlies a second portion of the channel region, wherein the control gate structure includes a nanocrystal stack having a height, wherein the control gate structure has a convex shape in a corner region formed at an intersection of a first plane substantially parallel to a top surface of the substrate and a second plane substantially parallel to a side surface of the control gate structure, wherein a ratio of a radius of the control gate structure in the corner region to the height of the nanocrystal stack is at least 0.5. The non-volatile memory cell may be further characterized by the ratio of the radius of the radius of the control gate structure in the corner region to the height of the nanocrystal stack being substantially 1. The non-volatile memory cell may be further characterized by the ratio of the radius of the control gate structure in the corner region to the height of the nanocrystal stack being greater than 1. The non-volatile memory cell may be further characterized by the select gate structure having a concave shape in a corner region formed at an intersection of the first plane substantially parallel to the top surface of the substrate and a third plane substantially parallel to a side surface of the select gate structure. The non-volatile memory cell may be further characterized by the first portion and the second portion overlapping.

Also described is a non-volatile memory cell having a substrate, a select gate structure, and a control gate structure. The substrate has formed therein a source region and a drain region defining a channel region between the source region and the drain region. The select gate structure is formed over the substrate. The select gate structure overlies a first portion of the channel region. The control gate structure is formed adjacent to the select gate structure. The control gate structure overlies a second portion of the channel region. The first portion and the second portion overlap. The control gate structure includes a nanocrystal stack having a height. The control gate structure has a convex shape in a corner region formed at an intersection of a first plane substantially parallel to a top surface of the substrate and a second plane substantially parallel to a side surface of the control gate structure. A ratio of a radius of the control gate structure in the corner region to the height of the nanocrystal stack is at least 0.5. The non-volatile memory cell may be further characterized by the ratio of the radius of the control gate structure in the corner region to the height of the nanocrystal stack being substantially 1. The non-volatile memory cell may be further characterized by the ratio of radius of the control gate structure in the corner region to the height of the nanocrystal stack being greater than 1. The non-volatile memory cell may be further characterized by the select gate structure having a concave shape in a corner region formed at an intersection of the first plane substantially parallel to the top surface of the substrate and a third plane substantially parallel to a side surface of the select gate structure.

Further described is a method of forming a non-volatile memory cell. The method includes forming a polysilicon layer overlying a first insulating layer formed over a substrate. The method further includes etching the polysilicon layer to form a select gate structure formed overlying the first insulating layer, wherein the select gate structure has at least one concave sidewall. The method further includes forming a second insulating layer over the select gate structure and overlying at least a portion of the substrate. The method further includes forming a layer of nanocrystals overlying at least a portion of the second insulating layer. The method further includes forming a third insulating layer overlying the layer of nanocrystals. The method further includes forming a control gate structure adjacent to the select gate structure, wherein the control gate structure has a convex sidewall facing the at least one concave sidewall of the select gate structure. The method may further include forming a source region and a drain region on opposite sides of a channel region underlying the select gate structure and the control gate structure. The method may be further characterized by the select gate structure overlying a first portion of the channel region, wherein the control gate structure overlies a second portion of the channel region, and wherein the first portion and the second portion overlap. The method may be further characterized by the control gate structure including a nanocrystal stack, and wherein a ratio of a radius of the convex sidewall in a corner region formed at an intersection of a first plane substantially parallel to a top surface of the substrate and a second plane substantially parallel to a side surface of the control gate structure to a height of the nanocrystal stack is at least 0.5.

Additionally described is a method of forming a non-volatile memory cell. The method includes forming a polysilicon layer overlying a first insulating layer formed over a substrate. The method further includes etching the polysilicon layer to form an inverted-T select gate structure formed overlying the first insulating layer, wherein the inverted-T select gate structure has a concave shape in a corner region formed at an intersection of a first plane substantially parallel to a top surface of the substrate and a second plane substantially parallel to a side surface of the inverted-T select gate structure. The method further includes forming a second insulating layer overlying the inverted-T select gate structure. The method further includes forming a layer of nanocrystals overlying at least a portion of the second insulating layer. The method further includes forming a third insulating layer overlying the layer of nanocrystals. The method further includes forming a control gate structure adjacent to the inverted-T select gate structure, wherein the control gate structure has a convex shape facing the corner region. The method may further comprise forming a source region and a drain region on opposite sides of a channel region underlying the inverted-T select gate structure and the control gate structure. The method may be further characterized by the inverted-T select gate structure overlying a first portion of the channel region, wherein the control gate structure overlies a second portion of the channel region, and wherein the first portion and the second portion overlap. The method may be further characterized by the control gate structure including a nanocrystal stack, and wherein a ratio of radius of the control gate structure in the corner region to a height of the nanocrystal stack is at least 0.5.

Yet further disclosed is a method of forming a non-volatile memory cell. The method includes forming a polysilicon layer overlying a first insulating layer formed over a substrate. The method further includes etching the polysilicon layer to form a U-shaped polysilicon region, wherein the U-shaped polysilicon region has a concave shape in a first corner region formed at an intersection of a first plane substantially parallel to a top surface of the substrate and a second plane substantially parallel to a first inside surface of the U-shaped polysilicon region, and wherein the U-shaped polysilicon has a concave shape in a second corner region formed at an intersection of a third plane substantially parallel to the top surface of the substrate and a fourth plane substantially parallel to a second inside surface of the U-shaped polysilicon region. The method further includes etching a portion of the U-shaped polysilicon region to form a control gate region. The method further includes forming a second insulating layer overlying the control gate region and a remaining portion of the U-shaped polysilicon region. The method further includes forming a layer of nanocrystals overlying at least a portion of the second insulating layer forming a third insulating layer overlying the layer of nanocrystals. The method further includes forming a first select gate structure, a second select gate structure, a first control gate structure adjacent to the first select gate structure, and a second control gate structure adjacent to the second select gate structure, wherein the first control gate structure has a convex shape facing the first corner region, and the second control gate structure has a convex shape facing the second corner region. The method may further comprise forming a common source/drain region. The method may be further characterized by each of the first control gate structure and the second control gate structure including a nanocrystal stack, and wherein a first ratio of a radius of the first control gate structure in the first corner region to a height of the nanocrystal stack is at least 0.5, and wherein a second ratio of a radius of the second control gate structure in the second corner region to the height of the nanocrystal stack is at least 0.5.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, a top oxide and a bottom oxide were described but another insulating material may be substituted. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A non-volatile memory cell comprising:
    a substrate in which is formed a source region and a drain region defining a channel region between the source region and the drain region;
    a select gate structure formed over the substrate, wherein the select gate structure overlies a first portion of the channel region;
    a control gate structure formed adjacent to the select gate structure, wherein the control gate structure overlies a second portion of the channel region, wherein the control gate structure includes a nanocrystal stack having a height, wherein the control gate structure has a convex shape in a corner region formed at an intersection of a first plane substantially parallel to a top surface of the substrate and a second plane substantially parallel to a side surface of the control gate structure, wherein a ratio of a radius of the control gate structure in the corner region to the height of the nanocrystal stack is at least 0.5.

2. The non-volatile memory cell of claim 1, wherein the ratio of the radius of the radius of the control gate structure in the corner region to the height of the nanocrystal stack is substantially 1.

3. The non-volatile memory cell of claim 1, wherein the ratio of the radius of the control gate structure in the corner region to the height of the nanocrystal stack is greater than 1.

4. The non-volatile memory cell of claim 1, wherein the select gate structure has a concave shape in a corner region formed at an intersection of the first plane substantially parallel to the top surface of the substrate and a third plane substantially parallel to a side surface of the select gate structure.

5. The non-volatile memory cell of claim 1, wherein the first portion and the second portion overlap.

6. A non-volatile memory cell comprising:
    a substrate in which is formed a source region and a drain region defining a channel region between the source region and the drain region;
    a select gate structure formed over the substrate, wherein the select gate structure overlies a first portion of the channel region;
    a control gate structure formed adjacent to the select gate structure, wherein the control gate structure overlies a second portion of the channel region, wherein the first portion and the second portion overlap, wherein the control gate structure includes a nanocrystal stack having a height, wherein the control gate structure has a convex shape in a corner region formed at an intersection of a first plane substantially parallel to a top surface of the substrate and a second plane substantially parallel to a side surface of the control gate structure, wherein a ratio of a radius of the control gate structure in the corner region to the height of the nanocrystal stack is at least 0.5.

7. The non-volatile memory cell of claim 6, wherein the ratio of the radius of the control gate structure in the corner region to the height of the nanocrystal stack is substantially 1.

8. The non-volatile memory of cell claim 6, wherein the ratio of radius of the control gate structure in the corner region to the height of the nanocrystal stack is greater than 1.

9. The non-volatile memory cell of claim 6, wherein the select gate structure has a concave shape in a corner region formed at an intersection of the first plane substantially parallel to the top surface of the substrate and a third plane substantially parallel to a side surface of the select gate structure.

* * * * *